(12) United States Patent
Peritore et al.

(10) Patent No.: US 6,479,954 B1
(45) Date of Patent: Nov. 12, 2002

(54) CONTROL AND DRIVE SYSTEM FOR A SINGLE WINDING ELECTROMAGNETIC ACTUATOR EMPLOYING A SINGLE MULTIFUNCTION OPERATIONAL AMPLIFIER

(75) Inventors: Roberto Peritore, Trezzano sul Naviglio (IT); Andrea Merello, Arese (IT); Gianluca Ventura, Cinisello Balsamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 310 days.

(21) Appl. No.: 09/609,857

(22) Filed: Jul. 5, 2000

(30) Foreign Application Priority Data

Jul. 7, 1999 (IT) .......................................... VA99A0019

(51) Int. Cl.⁷ ............................... H02P 3/08; H02P 7/06
(52) U.S. Cl. ........................ 318/254; 318/138; 318/560; 318/439
(58) Field of Search ................................. 318/254, 138, 318/560, 439

(56) References Cited

U.S. PATENT DOCUMENTS

| | | | | | |
|---|---|---|---|---|---|
| 5,631,527 | A | * | 5/1997 | Canclini | 318/138 |
| 5,818,180 | A | * | 10/1998 | Canclini | 318/138 |
| 5,838,515 | A | * | 11/1998 | Mortazavi et al. | 360/75 |

* cited by examiner

*Primary Examiner*—Bao Q. Vu
(74) *Attorney, Agent, or Firm*—Lisa K. Jorgenson; Allen, Dyer, Doppelt, Milbrath & Gilchrist, P.A.

(57) ABSTRACT

A system for controlling and driving an electromagnetic actuator includes a unique operational amplifier in the regulation loop for driving the electromagnetic actuator and for monitoring, during different phases of operation, the current in the actuator and the back electromotive force. The new architecture allows for a considerable reduction of the area of integration of the system as a whole.

41 Claims, 3 Drawing Sheets

CONTROL AND DRIVE SYSTEM FOR A SINGLE WINDING ELECTROMAGNETIC ACTUATOR EMPLOYING A SINGLE MULTIFUNCTION OPERATIONAL AMPLIFIER

FIELD OF THE INVENTION

The present invention relates to electromagnetic actuators, and, more particularly, to a circuit for controlling and driving a single winding electromagnetic actuator, commonly referred to as a Voice Coil Motor (VCM).

BACKGROUND OF THE INVENTION

VCM actuators are used in numerous applications, such as, for example, hard disk drive (HDD) systems to position the read/write heads on the different tracks of the disk. One of the operations carried out in a HDD system by a VCM actuator is the positioning of the read/write head on a ramp for preventing impacts of the head on the surface of the disk when the equipment is subjected to shocks or abrupt movements.

These operations are commonly called ramp load and ramp unload operations. It is normally necessary to control the speed of the mechanical arm that supports the head during its swinging movements for carrying out these operations. The methods used to monitor the instantaneous speed of the arm include reading the back electromotive force (BEMF) whose level is proportional to the speed of the motor.

Fundamentally, this reading may be made using a circuit that reads the voltage during a null current condition in the winding of the motor. Under these conditions, the voltage detected corresponds only to the BEMF contribution given by the general equation:

$$E = L * \frac{di}{dt} + R * i + BEMF$$

The null current condition is usually obtained by momentarily placing in a condition of high impedance (tristate) the power stages that drive the winding of the motor. The duration of the high impedance is sufficient for delaying to zero the discharge current of the inductance of the winding through a recirculation path.

Known drive and control systems use a dedicated operational amplifier (OP-AMP) for detecting the BEMF. Moreover, such systems commonly include a second operational amplifier in the transconductance regulation loop circuit for driving the VCM that is used to monitor the current in the motor.

The BEMF is read after having opened the transconductance regulation loop and upon the discharge of the current in the winding of the VCM. Therefore, the BEMF voltage is read during an operating phase in which the information on the current in the motor is not required.

SUMMARY OF THE INVENTION

It is an object of the present invention to provide a control driving system based on the use of a unique operational amplifier. The operational amplifier is in the regulation loop for driving the electromagnetic actuator, and for measuring during distinct phases of operation the current of the motor and the induced BEMF.

This approach allows for a reduction of the area of integration of the system as a whole. The control and driving system, according to a first embodiment, comprises a single operational amplifier having two differential input stages in parallel with each other.

The first differential input stage has a noninverting input coupled to a reference voltage, and an inverting input connected to the output of the operational amplifier to form a transconductance feedback structure. The second differential input stage has the noninverting and inverting inputs respectively switchable to two nodes coincident with the terminals of the current sensing resistance connected in series to the winding of the electromechanical actuator. Alternatively, the noninverting and inverting inputs are respectively switchable to the two output nodes of the pair of power stages that drive the winding of the electromechanical actuator in a bridge configuration during a phase of detection of the electromotive force induced in the winding.

According to an alternative embodiment functionally equalivant to the first embodiment, the operational amplifier is equipped with three distinct differential input stages. The first differential input stage forms the feedback circuit, and may be similar to the one used in the embodiment previously described. The respective inputs of the second and third differential input stages are coordinately coupled to the two nodes coincident with the terminals of the current sensing resistor. The first differential input stage is coupled to the output nodes of the two power stages that drive the winding. A pair of path selectors select one of the second and third differential input stages for connecting in parallel to the first differential input stage.

DETAILED DESCRIPTION OF THE PREFERRED EMBODIMENTS

Figure 1:
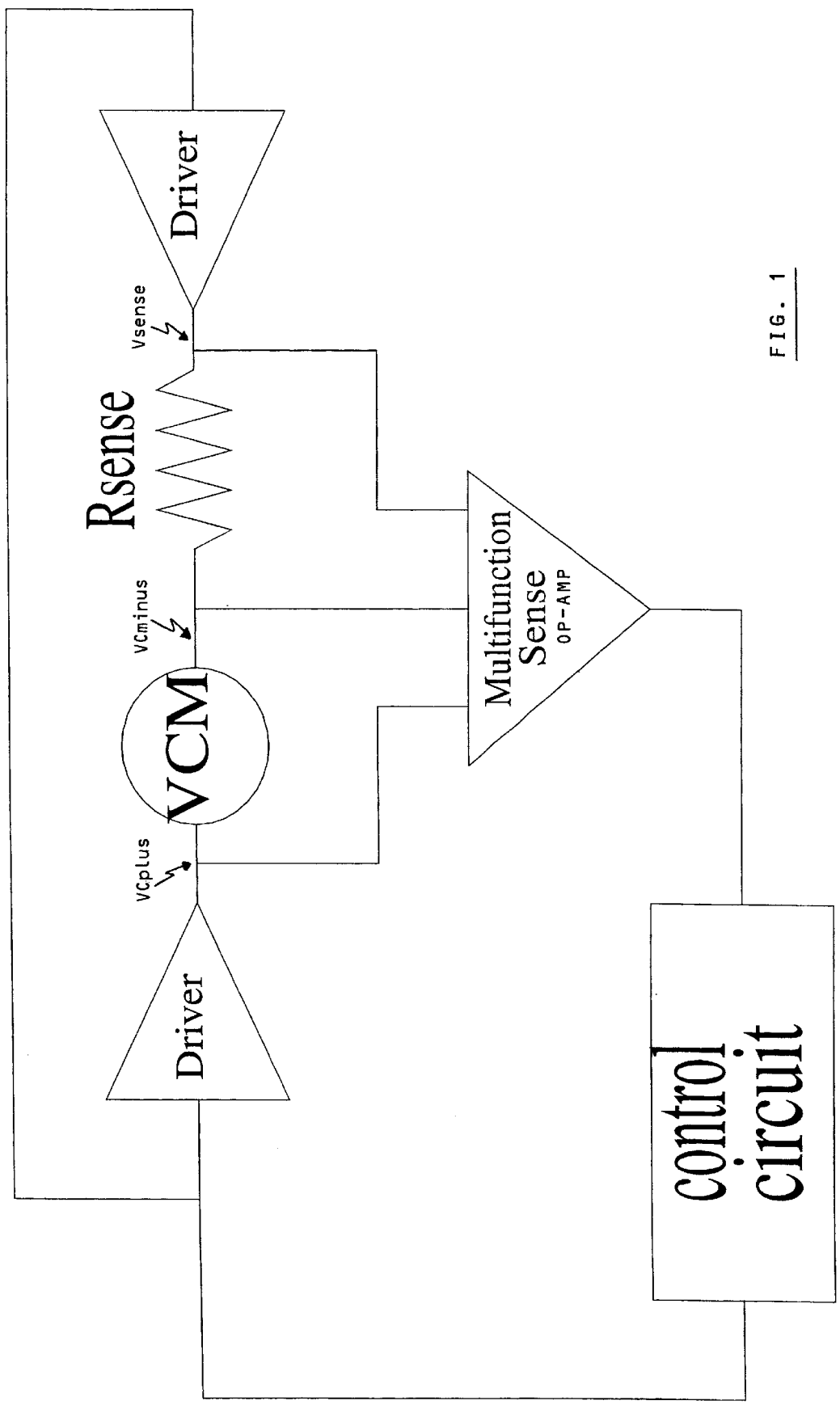
FIG. 1 is a block diagram of the control and driving system according to the present invention.

FIG. 1 depicts the control and driving system based on the use of a unique multifunction operational amplifier according to the present invention. The figure highlights the three circuit nodes that are monitored during distinct phases of operation using a unique sensing amplifier. The remaining elements of the diagram reproduce a typical architecture of a VCM electromagnetic actuator.

Figure 2:
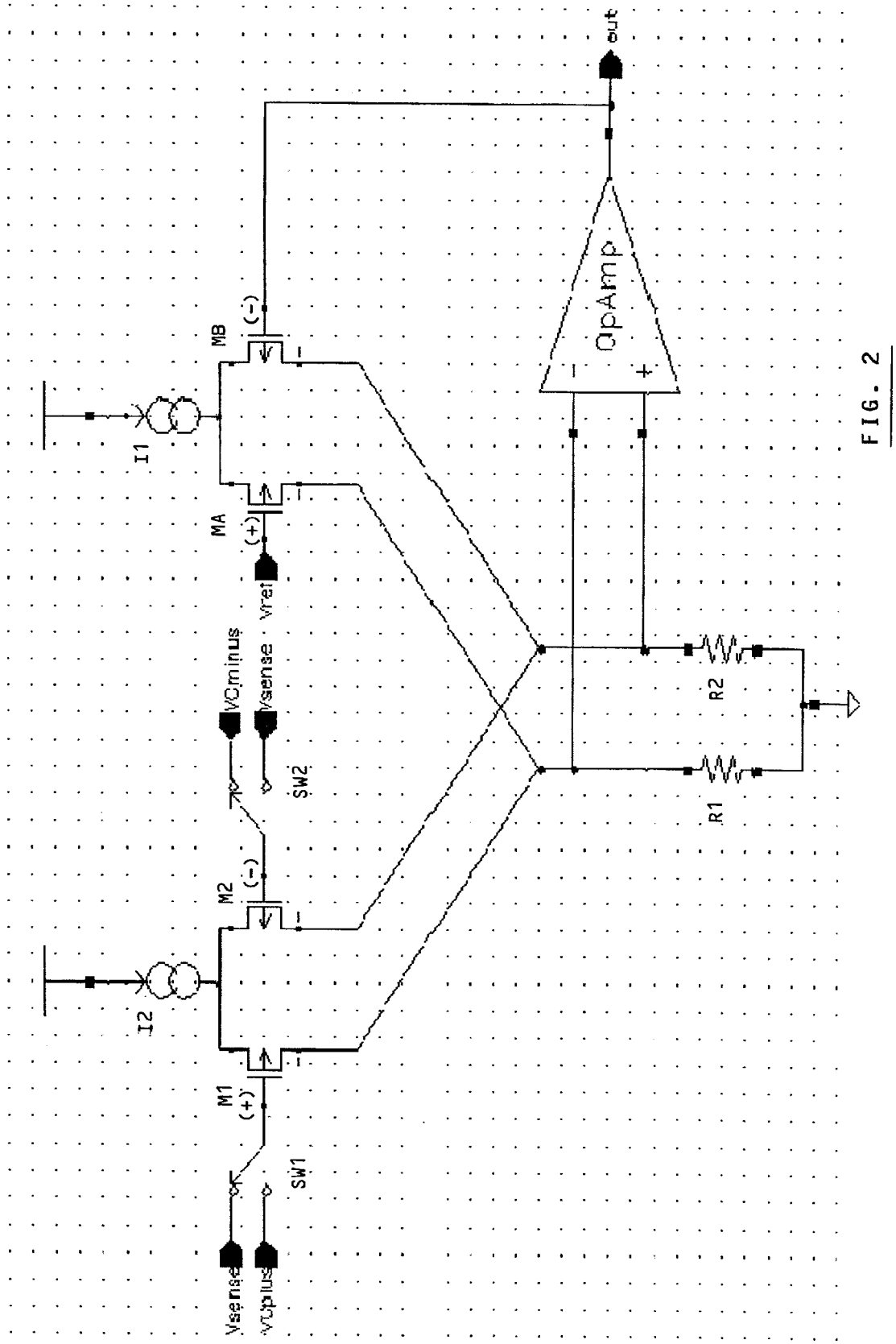
FIG. 2 is a circuit diagram according to a first embodiment of the single multifunction operational amplifier illustrated in FIG. 1.

FIG. 2 is a circuit diagram of the block MULTIFUNCTION SENSE OP_AMP of FIG. 1. The operational amplifier OP_AMP has two distinct differential input stages. The first includes a differential pair of transistors MA and MB, and the bias current generator I1. The second differential input stage includes the pair of transistors M1 and M2, and the bias current generator I2.

The two differential input stages are functionally connected in parallel to the inverting and noninverting inputs of the operational amplifier OP_AMP. The pair of differential input stages share the load elements which are represented by the resistances R1 and R2 in the illustrated example. The resistances R1 and R2 are replaceable by other equivalent load elements.

Referring to FIG. 2, the circuit of the multifunction operational amplifier comprises a pair of path selectors SW1 and SW2 controlled by the CONTROL CIRCUIT of the system for controlling and driving the VCM in order to switch the noninverting inputs (+) and inverting (−) inputs of the stage, respectively on the two nodes corresponding to the terminals of the current sensing resistance, Rsense, as shown in FIG. 1. This is done during the normal driving of the motor or on the output nodes, Vcplus and Vsenses, of the two power stages DRIVER that drive the VCM electromagnetic actuator, during a phase of momentary interruption of the driving for sensing the BEMF induced in the winding of the motor by the motion of the actuator.

The two path selectors SW1 and SW2 formed by integrated analog switches must function correctly even if the switches are coupled to low level voltages or to high level voltages exceeding the supply voltage of the circuit. This phenomena is due to the inductive load formed by the VCM winding. This implies the need to design integrated analog switches with dielectric characteristics sufficient to withstand the enhanced electrical stresses.

Figure 3:
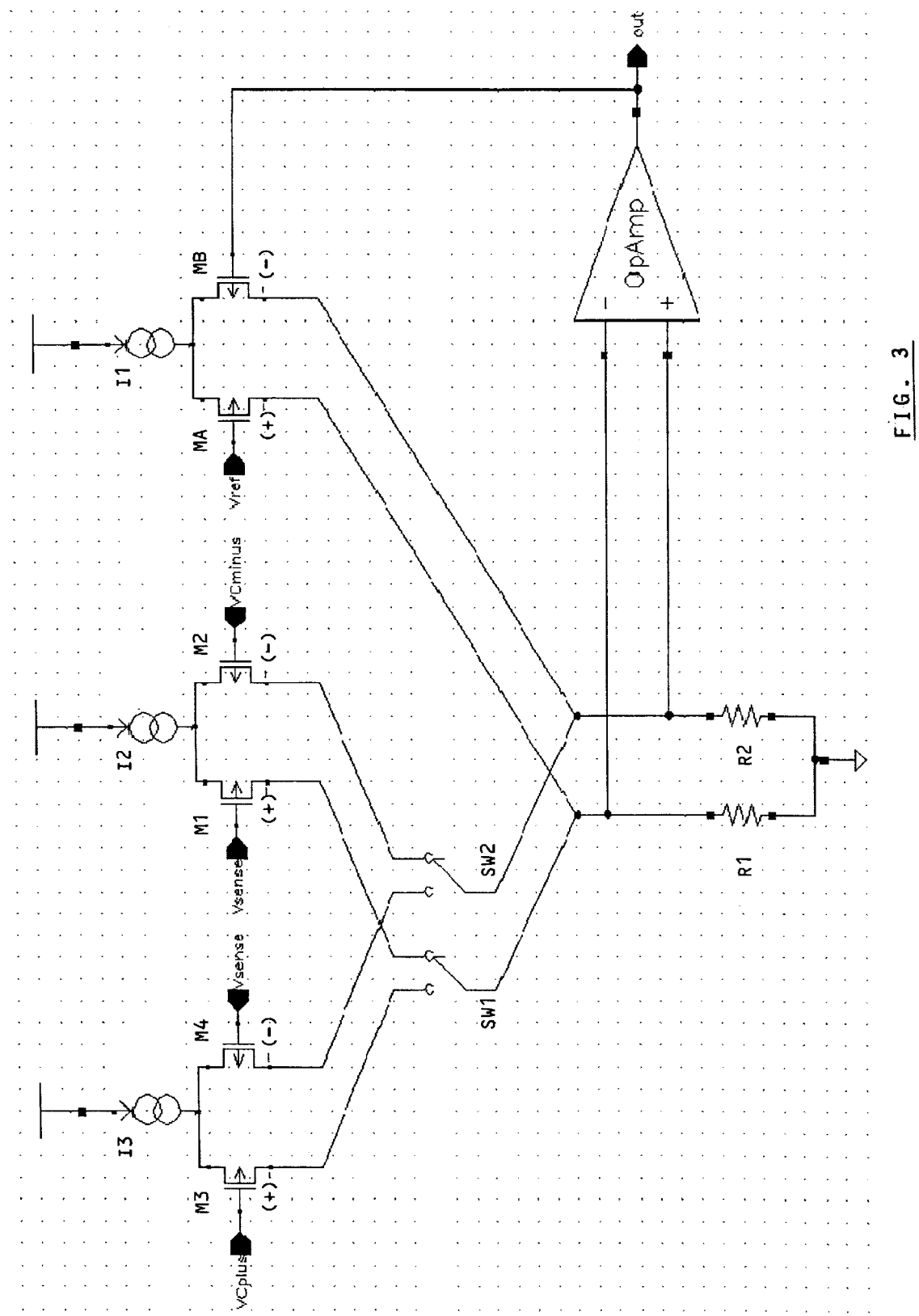
FIG. 3 is a circuit diagram according to an alternative embodiment of the single multifunction operational amplifier illustrated in FIG. 1.

This problem, though it may be overcome by an appropriate design of the devices, may be avoided according to an alternative embodiment of the system of the invention. As illustrated in FIG. 3, this alternative embodiment is based on a third differential input stage comprising the pair of transistors M3 and M4, and the bias current generator I3.

By comparing the diagram of FIG. 3 with that of FIG. 2, rather than switching the inputs of the second differential input stage, one of the second and third differential input stages are selected by the pair of path selectors SW1 and SW2.

In addition to considerably reducing the area of integration by using a unique operational amplifier, the system of the present invention is advantageous because it halves the number of comparators of the analog/digital conversion to implement the ramp load/unload algorithm in the control circuit of the system. The system exploits the same comparators for both the valuation of the BEMF and the current in the winding of the motor without using additional path selectors. The structure gm/gm of the operational amplifier also insures a high common mode rejection (CMRR).

What is claimed is:

1. A system for controlling and driving an actuator comprising:
   a current sensing resistance to be connected in series with the actuator;
   a pair of power stages connected to said current sensing resistance and to the actuator for driving the actuator in a bridge configuration;
   an operational amplifier for monitoring current forced in a winding of the actuator; and
   a control circuit connected between an output of said operational amplifier and said pair of power stages;
   said operational amplifier comprising
      a first differential input stage having a noninverting input coupled to a reference voltage and an inverting input coupled to the output of said operational amplifier for forming a transconductance feedback loop, and
      a second differential input stage connected in parallel to said first differential input stage and having a noninverting input and an inverting input respectively switchable between terminals of said current sensing resistance during a driving phase, and outputs of said pair of power stages during a phase of momentary interruption of the driving for sensing a zero-crossing of the back electromotive force (BEMF).

2. A system according to claim 1, wherein said operational amplifier further comprises a pair of path selectors for respectively switching the noninverting and inverting inputs of said second differential input stage.

3. A system according to claim 1, wherein said first and second differential input stages each comprises a pair of transistors and a bias current generator connected thereto.

4. A system according to claim 1, wherein said operational amplifier amplifies a difference signal between the reference voltage and a voltage present on said current sensing resistance for monitoring the current forced in the winding of the actuator.

5. A system according to claim 1, wherein said control circuit momentarily places in a high impedance condition said pair of power stages.

6. A system according to claim 1, wherein said control circuit masks a discharge phase of an inductance of the actuator.

7. A system according to claim 1, wherein said control circuit detects the zero crossing of the BEMF induced by motion of the actuator during the momentary interruption of the driving.

8. A system according to claim 1, wherein the actuator comprises a voice coil motor.

9. A system for controlling and driving an actuator comprising:
   a current sensor connected in series to the actuator;
   a pair of power stages connected to said current sensor and to the actuator for driving the actuator;
   an operational amplifier for monitoring current forced in a winding of the actuator; and
   a control circuit connected between an output of said operational amplifier and said pair of power stages;
   said operational amplifier comprising
      a first differential input stage having a first input coupled to a reference voltage and a second input coupled to the output of said operational amplifier for forming a feedback loop, and
      a second differential input stage connected in parallel to said first differential input stage and having a first input and a second input respectively switchable between terminals of said current sensor, and outputs of said pair of power stages.

10. A system according to claim 9, wherein the first input and the second input of said second differential input stage are switched to terminals of said current sensor during a driving phase.

11. A system according to claim 9, wherein the first input and the second input of said second differential input stage are switched to outputs of said pair of power stages during a phase of momentary interruption of the driving for sensing a zero-crossing of the back electromotive force (BEMF).

12. A system according to claim 9, wherein said first and second differential input stages each comprises a pair of transistors and a bias current generator connected thereto.

13. A system according to claim 9, wherein said pair of power stages are connected to said current sensor and to the actuator for driving the actuator in a bridge configuration.

14. A system according to claim 9, wherein said operational amplifier further comprises a pair of path selectors for respectively switching the first and second inputs of said second differential input stage.

15. A system according to claim 9, wherein said operational amplifier amplifies a difference signal between the reference voltage and a voltage present on said current sensor for monitoring the current forced in the winding of the actuator.

16. A system according to claim 9, wherein the first input is a noninverting input and the second input is an inverting input.

17. A system for controlling and driving an actuator comprising:
- a current sensing resistance to be connected in series with the actuator;
- a pair of power stages connected to said current sensing resistance and to the actuator for driving the actuator in a bridge configuration;
- an operational amplifier for monitoring current forced in a winding of the actuator; and
- a control circuit connected between an output of said operational amplifier and said pair of power stages;

said operational amplifier comprising
- a first differential input stage having a noninverting input coupled to a reference voltage and an inverting input coupled to the output of said operational amplifier for forming a transconductance feedback loop,
- a second differential input stage connected in parallel to said first differential input stage and having a noninverting input and an inverting input connected to terminals of said current sensing resistance during a driving phase,
- a third differential input stage connected in parallel to said first differential input stage and having a noninverting input and an inverting input connected to outputs of said pair of power stages during a phase of momentary interruption of the driving for sensing a zero-crossing of the back electromotive force (BEMF), and
- a pair of path selectors for switching said second and third differential input stage in parallel to said first differential input stage during respective phases of operation.

18. A system according to claim 17, wherein said first, second and third differential input stages each comprises a pair of transistors and a bias current generator connected thereto.

19. A system according to claim 17, wherein said operational amplifier amplifies a difference signal between the reference voltage and a voltage present on said current sensing resistance for monitoring the current forced in the winding of the actuator.

20. A system according to claim 17, wherein said control circuit momentarily places in a high impedance condition said pair of power stages.

21. A system according to claim 17, wherein said control circuit masks a discharge phase of an inductance of the actuator.

22. A system according to claim 17, wherein said control circuit detects the zero crossing of the BEMF induced by motion of the actuator during the momentary interruption of the driving.

23. A system for controlling and driving an actuator comprising:
- a current sensor connected in series to the actuator;
- a pair of power stages connected to said current sensor resistance and to the actuator for driving the actuator;
- an operational amplifier for monitoring current forced in a winding of the actuator; and
- a control circuit connected between an output of said operational amplifier and said pair of power stages;

said operational amplifier comprising
- a first differential input stage having a first input coupled to a reference voltage and a second input coupled to the output of said operational amplifier for forming a feedback loop,
- a second differential input stage connected in parallel to said first differential input stage and having a first input and a second input connected to terminals of said current sensor,
- a third differential input stage connected in parallel to said first differential input stage and having a first input and a second input connected to outputs of said pair of power stages, and
- a pair of path selectors for switching said second and third differential input stage in parallel to said first differential input stage during respective phases of operation.

24. A system according to claim 23, wherein said first, second and third differential input stages each comprises a pair of transistors and a bias current generator connected thereto.

25. A system according to claim 23, wherein the first input and the second input of said second differential input stage are switched to terminals of said current sensor during a driving phase.

26. A system according to claim 23, wherein the first input and the second input of said third differential input stage are switched to outputs of said pair of power stages during a phase of momentary interruption of the driving for sensing a zero-crossing of the back electromotive force (BEMF).

27. A system according to claim 23, wherein said pair of power stages are connected to said current sensor and to the actuator for driving the actuator in a bridge configuration.

28. A system according to claim 23, wherein said operational amplifier amplifies a difference signal between the reference voltage and a voltage present on said current sensor for monitoring the current forced in the winding of the actuator.

29. A system according to claim 23, wherein the first input is a noninverting input and the second input is an inverting input.

30. A method for controlling and driving an actuator comprising:
- sensing current conducting in the actuator using a current sensor;
- driving the actuator in a bridge configuration using a pair of power stages connected to the current sensor and to the actuator; and
- monitoring current forced in a winding of the actuator using an operational amplifier, the monitoring comprising
  - using a feedback loop formed by a first differential input stage having a first input coupled to a reference voltage and a second input coupled to the output of the operational amplifier, and
  - respectively switching a first input and a second input of a second differential input stage connected in parallel to the first differential input stage between terminals of the current sensor, and outputs of the pair of power stages.

31. A method according to claim 30, wherein the first input and the second input of the second differential input stage are switched to terminals of the current sensor during a driving phase.

32. A method according to claim 30, wherein the first input and the second input of the second differential input stage are switched to outputs of the pair of power stages during a phase of momentary interruption of the driving for sensing a zero-crossing of the back electromotive force (BEMF).

33. A method according to claim 30, wherein respectively switching comprises switching a pair of path selectors for switching the first and second inputs of the second differential input stage between terminals of the current sensor and outputs of the pair of power stages.

34. A method according to claim 30, wherein the operational amplifier amplifies a difference signal between the reference voltage and a voltage present on the current sensor for monitoring the current forced in the winding of the actuator.

35. A method according to claim 30, wherein the first input is a noninverting input and the second input is an inverting input.

36. A method for controlling and driving an actuator comprising:

sensing current conducting in the actuator using a current sensor;

driving the actuator in a bridge configuration using a pair of power stages connected to the current sensor and to the actuator; and monitoring current forced in a winding of the actuator using an operational amplifier, the monitoring comprising using a feedback loop formed by a first differential input stage having a first input coupled to a reference voltage and a second input coupled to the output of the operational amplifier, and respectively switching a first input and a second input of a second differential input stage connected in parallel to the first differential input stage to terminals of the current sensing resistance, and switching a first input and a second input of a third differential input stage connected in parallel to the first differential input stage to outputs of the pair of power stages.

37. A method according to claim 36, wherein switching comprises switching a pair of path selectors connected to the second and third differential input stages for switching the second and third differential input stage in parallel to the first differential input stage during respective phases of operation.

38. A method according to claim 36, wherein the first input and the second input of the second differential input stage are switched to terminals of the current sensor during a driving phase.

39. A method according to claim 36, wherein the first input and the second input of the third differential input stage are switched to outputs of the pair of power stages during a phase of momentary interruption of the driving for sensing a zero-crossing of the back electromotive force (BEMF).

40. A method according to claim 36, wherein the operational amplifier amplifies a difference signal between the reference voltage and a voltage present on the current sensing resistance for monitoring the current forced in the winding of the actuator.

41. A method according to claim 36, wherein the first input is a noninverting input and the second input is an inverting input.

* * * * *